(12) United States Patent
Choi et al.

(10) Patent No.: US 6,927,447 B2
(45) Date of Patent: Aug. 9, 2005

(54) FLASH MEMORY DEVICES HAVING A SLOPED TRENCH ISOLATION STRUCTURE

(75) Inventors: Jeong-hyuk Choi, Gyeonggi-do (KR); Wang-chul Shin, Gyeonggi-do (KR); Jin-hyun Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/447,254

(22) Filed: May 28, 2003

(65) Prior Publication Data
US 2004/0016956 A1 Jan. 29, 2004

(30) Foreign Application Priority Data
Jul. 29, 2002 (KR) ................................ 10-2002-0044637

(51) Int. Cl.[7] ............................................. H01L 29/788
(52) U.S. Cl. ......................... 257/315; 257/315; 257/374
(58) Field of Search ................................. 257/315, 288, 257/244, 510, 204; 438/296, 294, 424

(56) References Cited

U.S. PATENT DOCUMENTS 6,146,970 A * 11/2000 Witek et al. ................ 438/424

* cited by examiner

*Primary Examiner*—David Nelms
*Assistant Examiner*—Thinh T Nguyen
(74) *Attorney, Agent, or Firm*—Myers Bigel Sibley & Sajovec, P.A.

(57) ABSTRACT

A method of fabricating a flash memory device. Parallel mask patterns are formed on a substrate. The substrate is etched using the mask patterns to form trenches. An insulating layer pattern is formed in the trenches and an area between the mask patterns. The mask patterns are removed to expose an upper sidewall of the insulating layer pattern that protrudes away from a top surface of the substrate. The insulating layer pattern is isotropically etched to form sloped sidewalls that protrude away from the top surface of the substrate.

16 Claims, 19 Drawing Sheets to# FLASH MEMORY DEVICES HAVING A SLOPED TRENCH ISOLATION STRUCTURE

RELATED APPLICATION

This application claims priority from Korean Patent Application No. 2002-44637, filed Jul. 29, 2002, the disclosure of which is hereby incorporated herein by reference in its entirety as if set forth fully herein.

FIELD OF THE INVENTION

The present invention relates to flash memory devices and, more specifically, to flash memory devices having shallow trench isolation structures and methods of fabricating the same.

BACKGROUND OF THE INVENTION

Shallow trench isolation (STI) technology is frequently used as an alternative to local oxidation of silicon (LOCOS) technology. STI technology generally involves forming a groove as a boundary between a device isolation layer and an active region. Self-aligned trench isolation techniques have been suggested in which a gate conductive layer is formed during the formation of a trench isolation layer.

Referring to FIG. 1, a typical flash memory device includes parallel device isolation layers 12 and 34 to define active regions. Control gate electrodes 42 cross the device isolation layers 12 and 34 in parallel. Floating gate electrodes 16a and 38a are formed on a substrate between the device isolation layers 12 and 34. The floating gate electrodes 16a and 38a are disposed between the control gate electrode 42 and the substrate. Edges of the floating gate electrodes 16a and 38a overlap the device isolation layers 12 and 34.

A method of fabricating a conventional flash memory device having a shallow trench isolation structure is described with reference to FIGS. 2–6.

Referring to FIG. 2, a buffer oxide layer 2 and a hard mask layer 4 are formed on a semiconductor substrate 1. The hard mask layer 4 may be, for example, silicone nitride. The buffer oxide layer 2 may buffer a stress applied to the substrate 1 by means of the hard mask layer 4.

Referring to FIG. 3, the hard mask layer 4 and the buffer oxide layer 2 are successively patterned to form a buffer oxide pattern 2a and a hard mask pattern 4a on the substrate 1. Using the hard mask pattern 4a as a mask, the substrate 1 is etched to form a trench 6 in the substrate 1. During this etch, the substrate 1 may be damaged, for example by defects in the sidewalls of the trench 6.

Referring to FIG. 4, in an attempt to cure the defects, the substrate 1 in the region of the trench 6 is annealed to form a trench oxide layer 10 on the inner sidewall of the trench 6. An insulating layer pattern 8 is formed on the trench oxide layer 10 to fill the trench 6 as well as a gap area between the hard mask patterns 4a. The insulating layer pattern 8 may be, for example, an oxide layer or a stack structure in which a silicon nitride layer and an oxide layer are sequentially stacked.

Referring to FIG. 5, the hard mask pattern 4a is removed, for example, by an isotropic etch technique using a phosphoric acid solution. The buffer oxide pattern 2a is removed, and then a sacrificial oxide layer is formed on the remaining structure to cure surface defects in the semiconductor substrate between the insulating layer patterns 8. The sacrificial oxide layer is removed to form a device isolation pattern 12 filling the trench 6. A major top surface of the device isolation pattern 12 is even with or lower than the surface of the semiconductor substrate 1. When the buffer oxide pattern 2a and the sacrificial oxide layer are removed, the device isolation pattern 12 may be etched such that a dent is formed along an edge of the trench 6.

Referring to FIG. 6, a tunnel insulating layer and then a conductive layer are formed on an entire surface of the substrate 1 and the device isolation patterns 12. The tunnel insulation layer and the conductive layer are patterned to form a tunnel insulating layer pattern 14 and a conductive layer pattern 16 between the device isolation patterns 12. An edge of the conductive layer pattern 16 overlaps an upper side of the device isolation pattern 12. In a subsequent process, the conductive layer pattern 16 may be used as a floating gate pattern of the flash memory.

Referring, to FIG. 6, an electric field may concentrate on the conductive layer pattern 16, used as a floating gate pattern, along the edge of the trench 6. Consequently, a parasitic transistor may be formed along the edge of the trench 6 and may cause leakage current during memory operations. When a major top surface of the device isolation pattern 12 is higher than or even with a major top surface of the semiconductor substrate 1, a parasitic transistor may be formed by a control gate of the memory cell as well as the floating gate.

Methods of fabricating a flash memory device having a self-aligned shallow trench isolation structure are now described with reference to FIGS. 7–11.

Referring to FIG. 7, a tunnel insulating layer 20, a first polysilicon layer 22, and a silicon nitride layer 24 are sequentially formed on a semiconductor substrate 18.

Referring to FIG. 8, the silicon nitride layer 24, the first polysilicon layer 22, and the tunnel insulating layer 20 are successively patterned to form a tunnel insulating layer pattern 20a, a first polysilicon pattern 22a, and a silicon nitride pattern 24a on the semiconductor substrate 18. Using the silicon nitride pattern 24a as a mask, the substrate 18 is etched to form a trench 26.

Referring to FIG. 9, in order to cure defects that may occur in an inner sidewall of the trench 26, the substrate 18 is annealed to form a trench oxide layer 28 on the inner sidewall of the trench 26. During this annealing step, oxidation can occur along sidewalls of the first polysilicon patterns 22a and along where the first polysilicon patterns 22a and the semiconductor substrate 18 are in contact with edges of the tunnel insulating layer patterns 20a. Consequently, an undesirable bird's beak may occur at the edge of the tunnel insulating layer 20a. A trap density of the bird's beak may become large as write and erase operations are repetitively performed. Consequently, the bird's beak may deteriorate the data retention and/or life of the flash memory device.

An insulating layer pattern 30 is formed to fill the trench 26 on the trench oxide layer 28 and a gap area between the silicon nitride patterns 24a.

Referring to FIG. 10, the silicon nitride pattern 24a is removed to expose the first polysilicon pattern 22a. A device isolation pattern 34 is formed from the insulating layer pattern 30 in the trench 28 and extends along the sidewalls of the first polysilicon patterns 22a and the trench oxide layer 28. A second polysilicon layer is formed on an entire surface of the substrate 18, and then patterned to form a second polysilicon pattern 36 on the first polysilicon pattern 22a.

Referring to FIG. 11, an intergate dielectric 40 is formed on an entire surface of the substrate 18, including on the second polysilicon pattern 36. A control gate conductive layer 42 is formed on an entire surface of the intergate dielectric 40. The intergate dielectric 40 may be, for example, ONO (oxide/nitride/oxide) and the control gate conductive layer 42 may be polysilicon or metal polycide.

A conventional flash memory device having a self-aligned shallow trench isolation structure is illustrated in FIGS. 12–13.

Referring to FIGS. 11–12, the control gate conductive layer 42, the intergate dielectric 40, the second polysilicon pattern 36, and the first polysilicon pattern 22a are successively patterned to form an intergate dielectric pattern 40a and a control gate electrode 42a which are sequentially stacked to cross over the device isolation pattern 34, and to form a floating gate pattern 38 between the intergate dielectric pattern 40a and the tunnel insulating layer pattern 30a. The tunnel insulating layer pattern 20a between the control gate electrodes 42a may be patterned or unpatterned.

In the conventional flash memory device with the self-aligned trench isolation structure, the device isolation pattern 34 protrudes beyond a top surface of the semiconductor substrate 18, as shown in FIG. 12, and has a vertical sidewall. A stringer 44 may remain at a base of the protruding sidewall of the device isolation pattern 34 when the first and second polysilicon patterns 22a and 36 are patterned in order to form the floating gate pattern 38. The stringers 44, when present, may short-circuit the adjacent floating gate patterns 38. An overetch, using an isotropic etch process, is sometimes performed, using a wet etch or a dry etch after the floating gate pattern 38 is formed, to remove the stringers 44. An undercut 44 may result along a lower sidewall of the floating gate pattern 38, as shown in FIG. 13, so that a short channel effect may occur for the cell transistor and the gate line width in a cell array may be less uniform, which may result in increased variation in the cell characteristics. Moreover, following formation of a gate line, a large amount of oxygen atoms may be diffused through the bird's beak 32 (see FIG. 10) in a thermal oxidation process for curing etch damage, which may increase the thickness of the floating gate pattern 38. When the thickness of the floating gate pattern 38 is increased, a corresponding increase in parasitic capacitance may occur between adjacent floating gates patterns 38. The parasitic capacitance may result in variations of the threshold voltage of the flash memory cell.

SUMMARY OF THE INVENTION

Some embodiments of the present invention provide a flash memory device that includes a substrate, a plurality of parallel trenches in the substrate, and a device isolation pattern in the trenches that has sloped sidewalls that protrude away from a top surface of the substrate. The sloped protruding sidewalls of the device isolation pattern may reduce or eliminate the formation of stringers adjacent thereto on the substrate, and may thereby reduce or eliminate short-circuits between adjacent floating gate patterns In further embodiments, the flash memory device may include a tunnel insulating layer and a floating gate pattern. The tunnel insulating layer may be on the substrate between the device isolation patterns. The floating gate pattern may be on the tunnel insulating layer, and an edge of the floating gate pattern may laterally overlap an upper side of the device isolation pattern. An edge of the tunnel insulating layer that is adjacent to the device isolation pattern may be less thick than a central portion of the tunnel insulating layer between the device isolation pattern. The thinner edge portion of the tunnel insulating layer may allow increased tunneling and an associated faster programming speed of the flash memory device. The protruding sloped sidewalls of the device isolation pattern may laterally extend to overlap an edge portion of the top surface of the substrate.

Other embodiments of the present invention provide a method of fabricating a flash memory device. Parallel mask patterns are formed on a substrate. The substrate is etched using the mask patterns to form trenches. An insulating layer pattern is formed in the trenches and in an area between the mask patterns. The mask patterns are removed to expose an upper sidewall of the insulating layer pattern that protrudes away from a top surface of the substrate. The insulating layer pattern is isotropically etched to form sloped sidewalls that protrude away from the top surface of the substrate.

DETAILED DESCRIPTION

Figure 1:
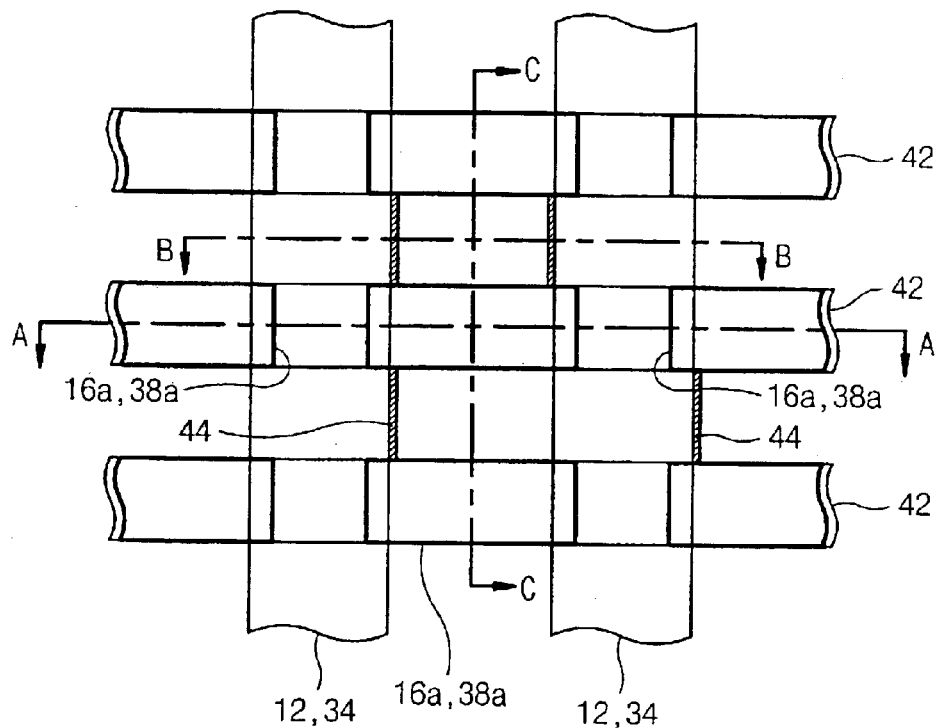
FIG. 1 is a top view of a cell area of a prior art flash memory.
Figure 2:
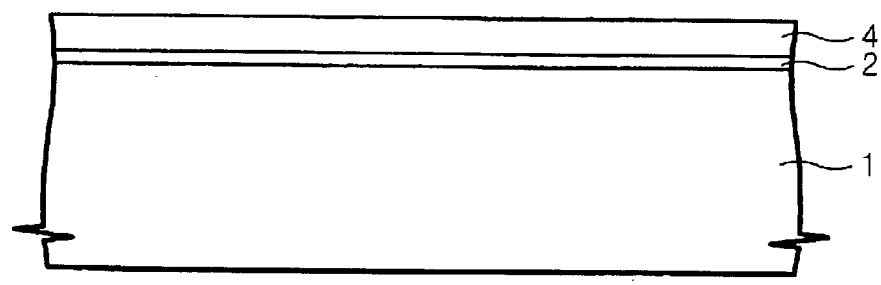
FIGS. 2–13 are cross-sectional views of prior art flash memory devices.
Figure 3:
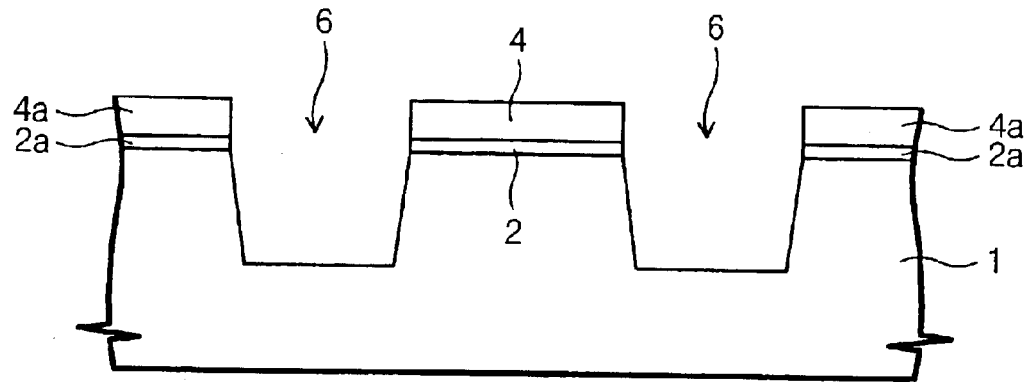
Figure 4:
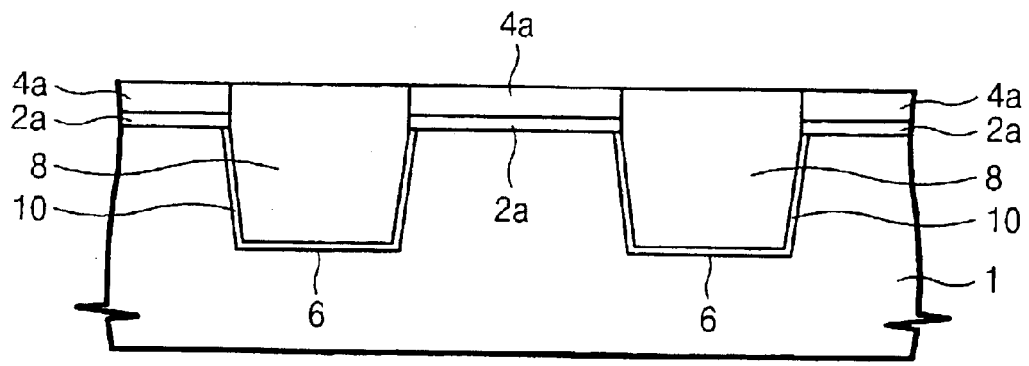
Figure 5:
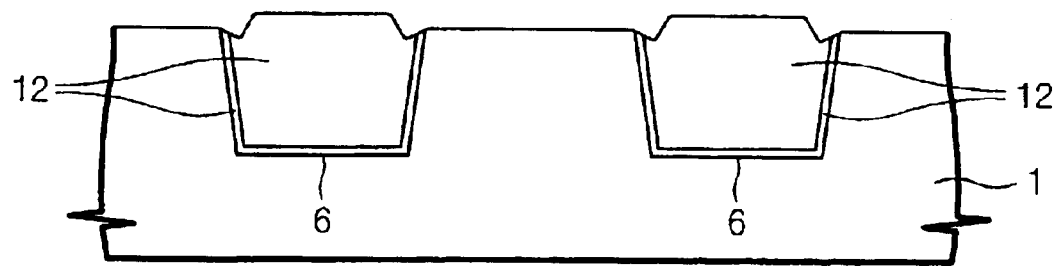
Figure 6:
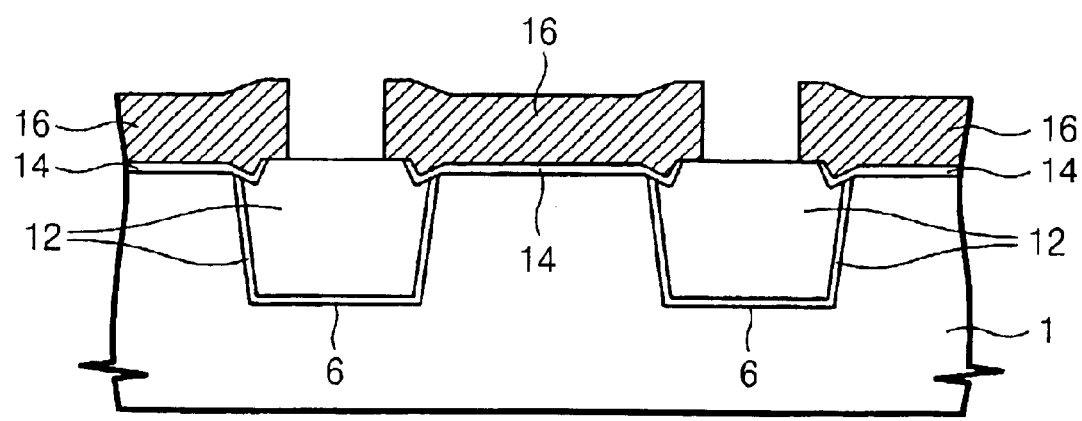
Figure 7:
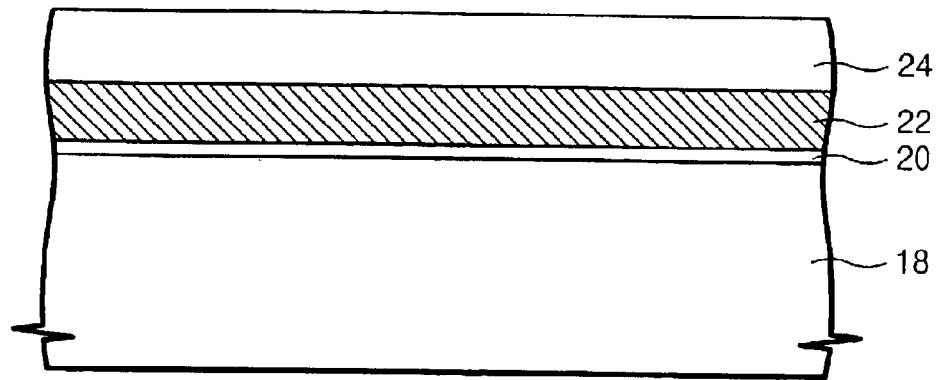
Figure 8:
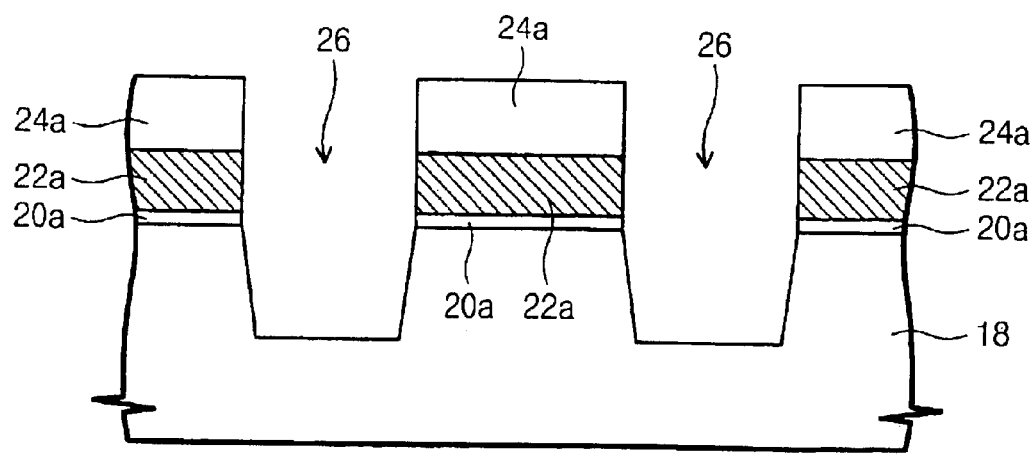
Figure 9:
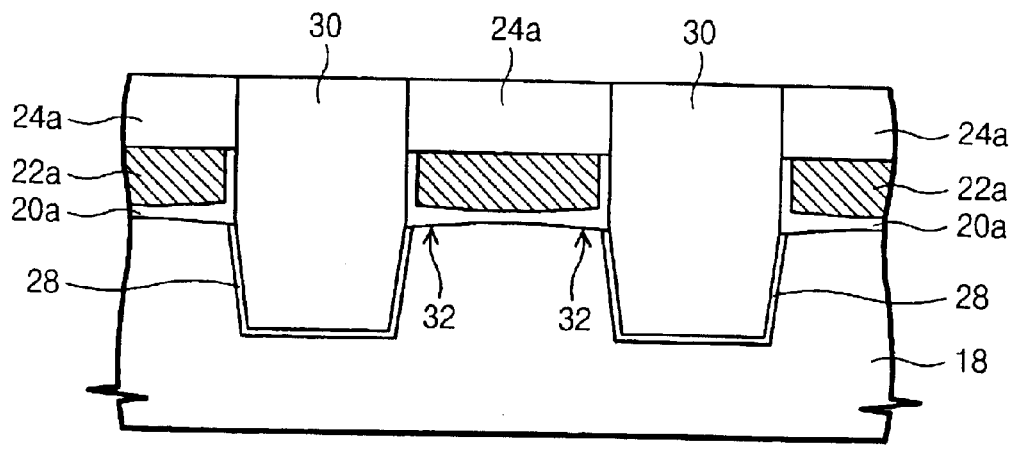
Figure 10:
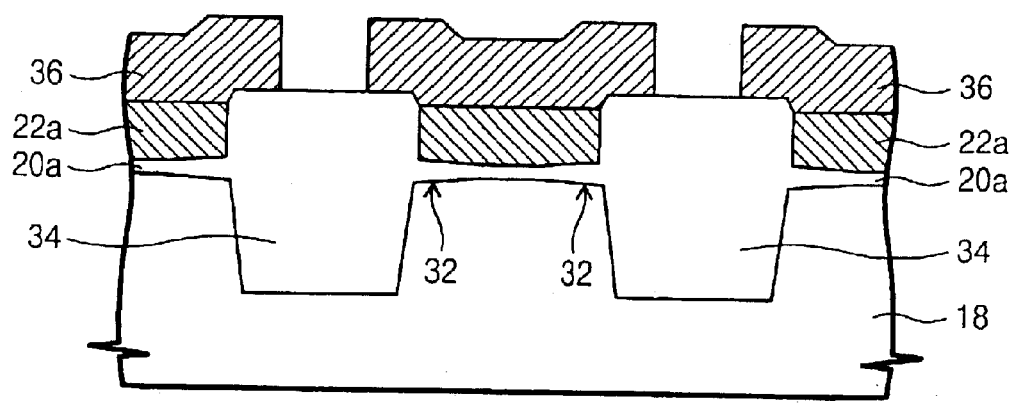

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

A flash memory device according to some embodiments of the present invention is now described with reference to FIG. 14.

Figure 14:
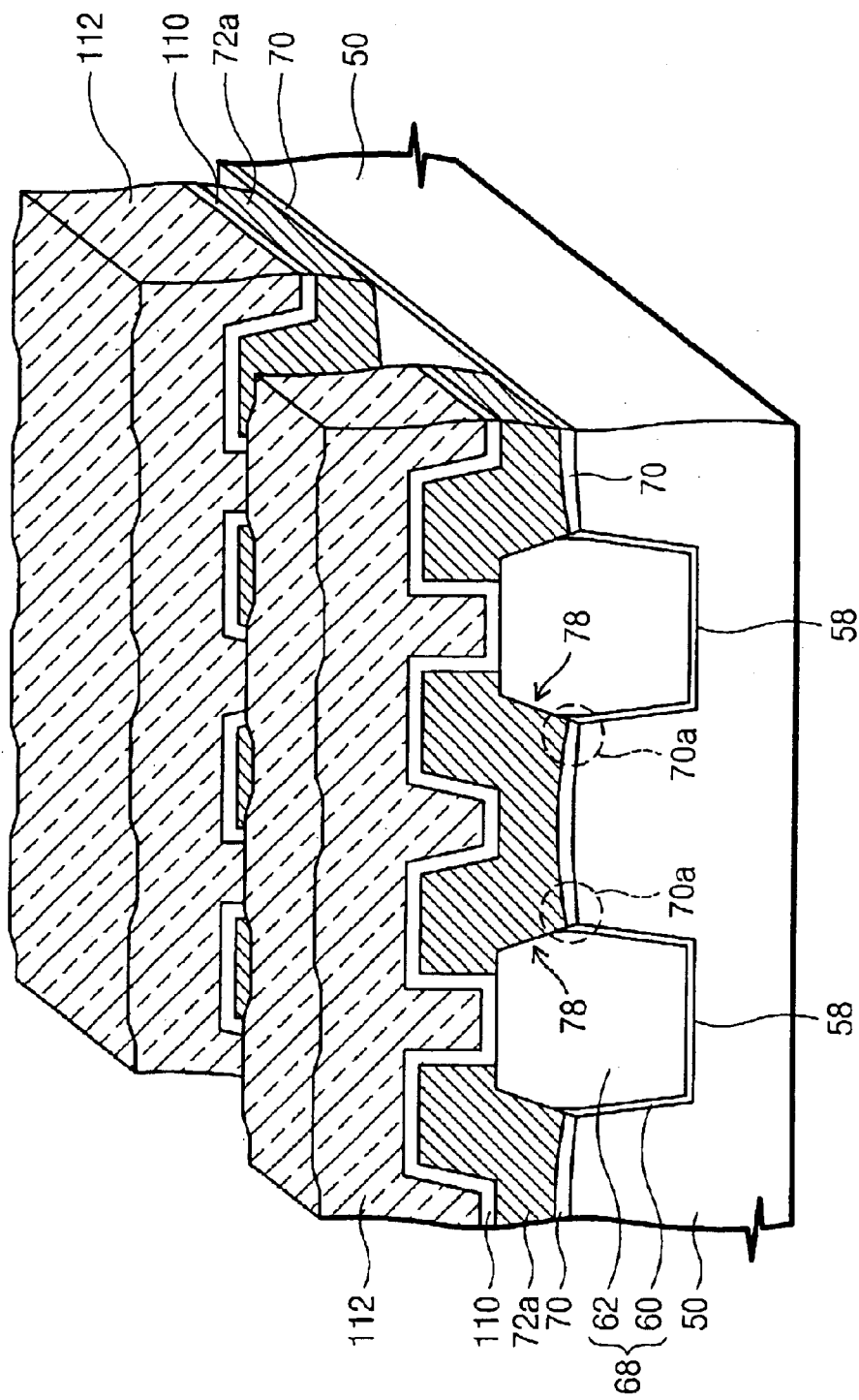
FIG. 14 is a perspective view of a flash memory device according to some embodiments of the present invention.

Referring to FIG. 14, a trench 58 is formed in a predetermined area of a semiconductor substrate 50, and a device isolation pattern 68 is formed in the trench 58. The device isolation pattern 68 may include a trench oxide layer 60 formed on an inner sidewall of the trench 58 and an insulating layer pattern 62 formed in the trench 58. An upper sidewall and top surface of the device isolation pattern 68 protrude beyond a major top surface of the substrate 50. The device isolation pattern 68 has sloped protruding sidewalls, so that it has a smaller width at the top surface than the upper width of the trench 58 in region 70a. A plurality of control gate electrodes 112 extend across the device isolation patterns 68 in parallel. A floating gate pattern 72a is between the control gate electrode 112 and the substrate 50, and is between the device isolation patterns 68. An intergate dielectric 110 is between the control gate electrode 112 and the floating gate pattern 72a. A tunnel insulating layer 70 is between the floating gate pattern 72a and the substrate 50. In some other embodiments, the tunnel insulating layer 70 may be formed on an entire surface of the semiconductor substrate 50 between the device isolation patterns 68. The sloped protruding sidewalls of the device isolation pattern 68 may reduce or eliminate the formation of stringers adjacent thereto on the substrate 50.

As a result, an edge portion of the tunnel insulating layer 70 that is adjacent to the device isolation pattern 68 in region 70a may be thinner than a central portion of the tunnel insulating layer 70 between the device isolation patterns 68, thereby avoiding formation of a bird's beak in region 70a. The thinner edge portion of the tunnel insulating layer 70 may allow increased tunneling and an associated faster programming speed of the flash memory device.

Figure 11:
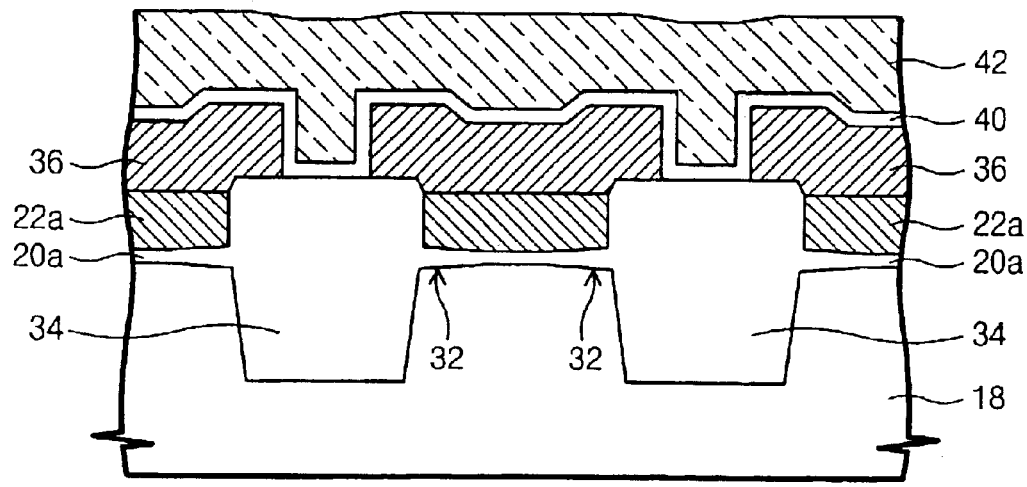
Figure 12:
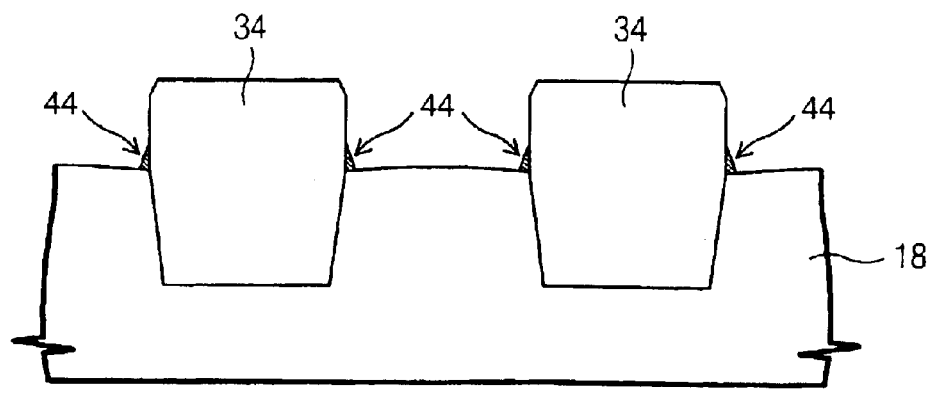
Figure 13:
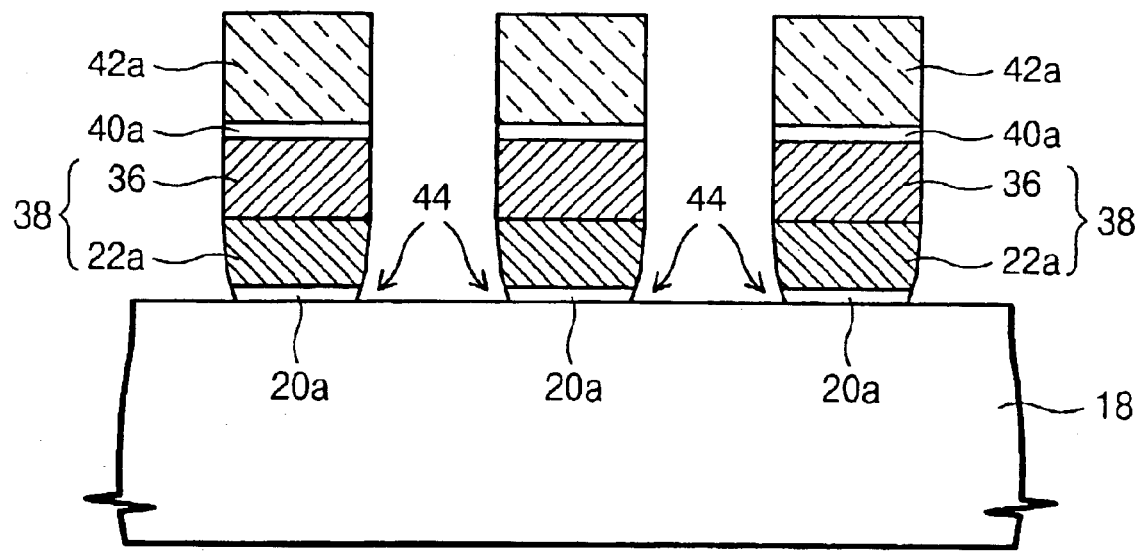

The floating gate pattern 72a may be conformally formed on the device isolation pattern 68 and the substrate 50. The interlayer dielectric pattern 110 may occupy a large area per cell transistor and a higher coupling ratio may be obtained as compared to the conventional flash memory device that is illustrated in FIG. 11. Moreover, the parasitic capacitance between the adjacent floating gate patterns 72a may be low, and a threshold voltage of a cell transistor may be more uniform compared to the conventional flash memory device that is illustrated in FIG. 11.

A method of fabricating the flash memory device according to the some embodiments of the present invention will now be described with reference to FIGS. 15–22.

Figure 15:
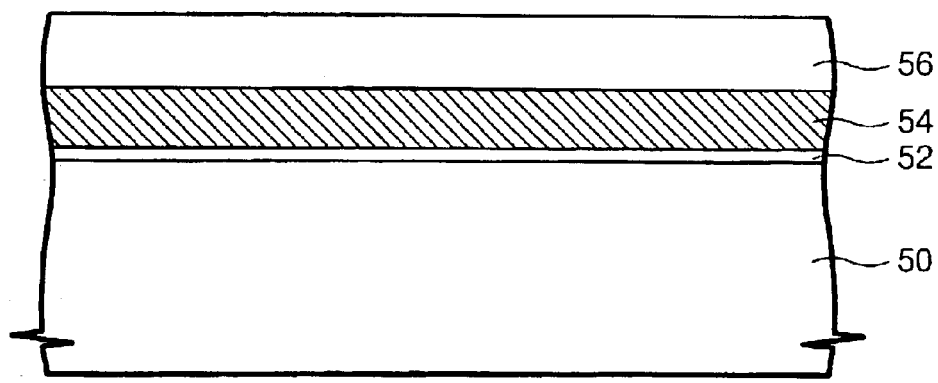
FIGS. 15–27 are cross-sectional views that illustrate steps for fabricating flash memory devices according to some embodiments of the present invention.

Referring to FIG. 15, a buffer oxide layer 52, a polysilicon layer 54, and a silicon nitride layer 56 may be sequentially formed on the semiconductor substrate 50. An additional oxide layer may be formed on the polysilicon layer 54, and the silicon nitride layer 56 may be formed on the additional oxide layer.

Figure 16:
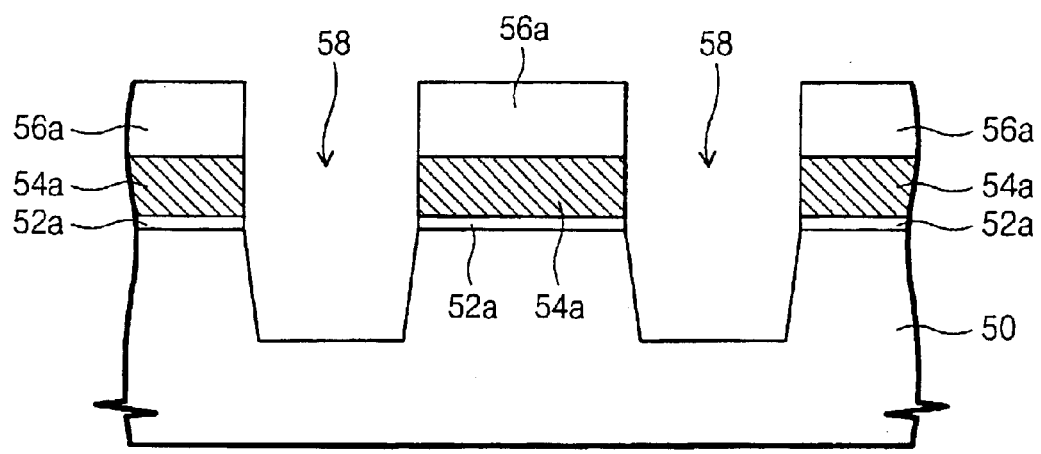

Referring to FIG. 16, the silicon nitride layer 56, the polysilicon layer 54, and the buffer oxide layer 52 may be successively patterned to form a plurality of hard mask pattern on the substrate 50. Each of the hard mask patterns may include a buffer oxide pattern 52a, a polysilicon pattern 54a, and a silicon nitride pattern 56a that are sequentially stacked. The hard mask pattern may be used as an etch-stop layer while etching the substrate 50 to form the trench 58.

Figure 17:
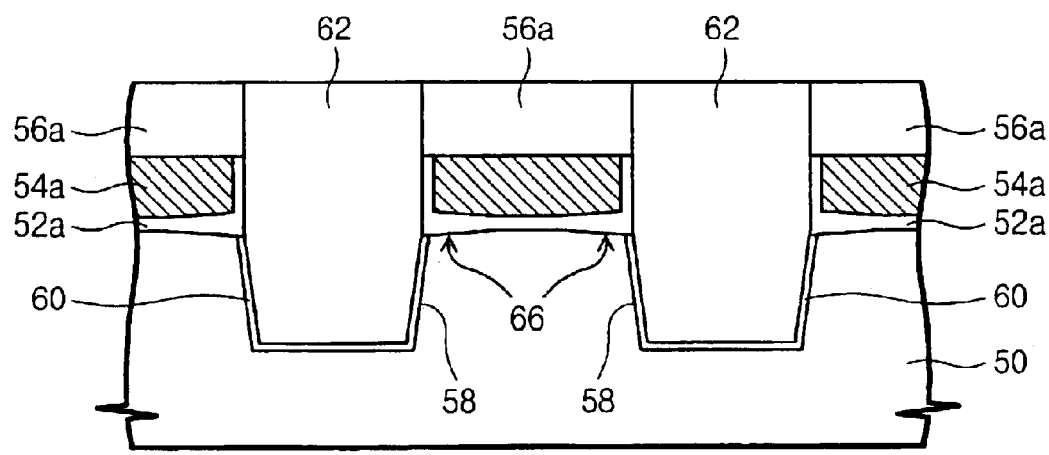

Referring to FIG. 17, the substrate 50 may be thermally oxidized to form the trench oxide layer 60 on an inner sidewall of the trench 58. As a result of the thermal oxidation, an edge portion of the buffer oxide layer 52a may become thicker than a more central portion of the buffer oxide layer 52a, and form a bird's beak 66 at the edge of the buffer oxide layer 52a. The insulating layer pattern 62 may be formed to fill the trench 58 and a gap area between the hard mask patterns. The insulating layer pattern 62 may be a material having a good trench filling property, such as high-density plasma (HDP) oxide or plasma enhanced oxide (PEOX).

Figure 18:
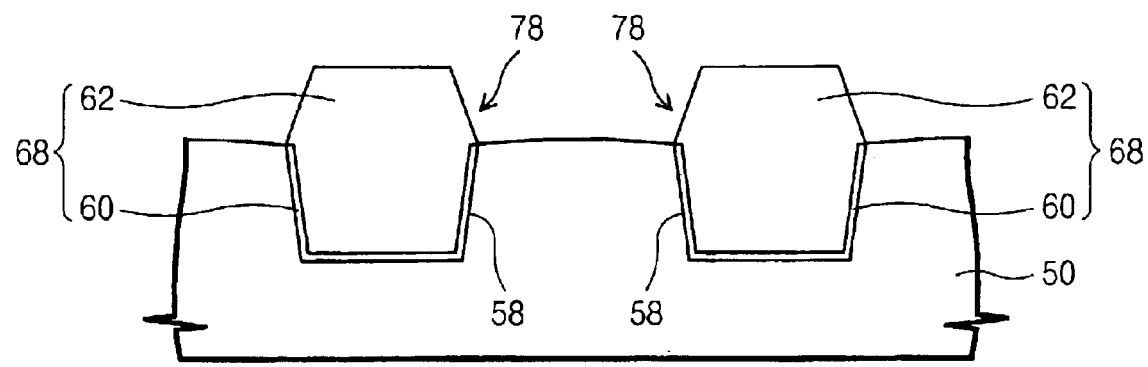

Referring to FIG. 18, the silicon nitride pattern 56a is removed, for example, by wet etching with a phosphoric acid solution. The polysilicon pattern 54a is removed, for example, using wet etching or dry etching. The buffer oxide layer 52a is also removed, for example, by wet etching.

The etching forms sloped sidewalls along major portions of the protruding insulating layer pattern 62. A dry etch and/or a wet etch may be alternately performed to adjust the height of the protruding portion of the insulating layer pattern 62. The insulating layer pattern 62 with the sloped sidewalls and the trench oxide layer 60 may thereby form the isolation pattern 68.

By forming a thermal oxide layer on the sidewall of the polysilicon pattern 54a during the formation of the trench oxide layer 58, the thermal oxide layer may prevent the device isolation pattern 68 along the edge of the trench 58 from being overetched during removal of the buffer oxide layer 52a. Consequently, it may be possible to prevent the formation of a dent at the edge of the trench 58. The substrate 50 may be further thermally oxidized to form a sacrificial oxide layer and to cure defects that may result from stresses on the substrate 50, for example stresses that may be created while the edge of the buffer oxide pattern 52a is grown to form the trench oxide layer 60.

Figure 19:
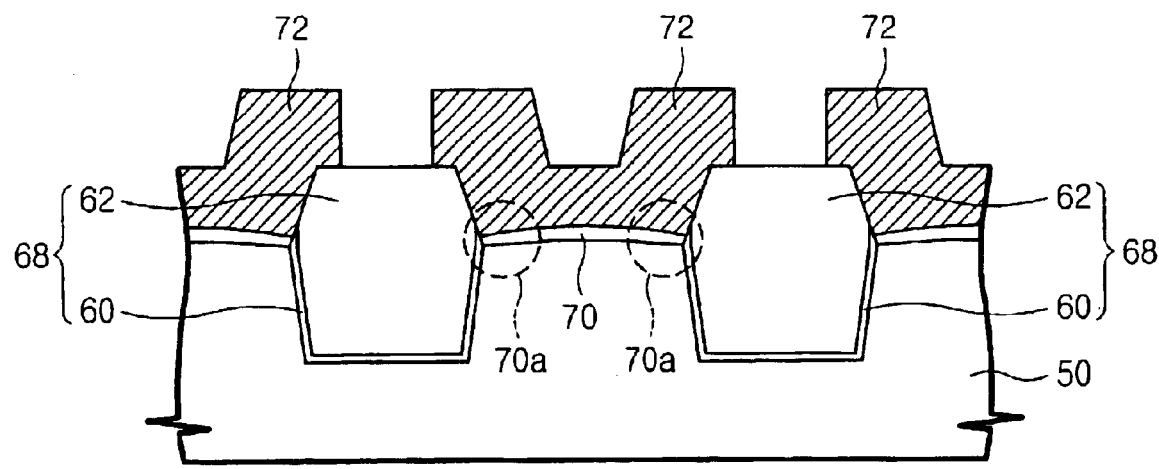

Referring to FIG. 19, the tunnel insulating layer 70 is formed on the substrate 50. The conductive layer pattern 72 is formed on the tunnel insulating layer 70. The conductive layer pattern 72 may conformally cover the tunnel insulating layer 70 and a protruding sidewall of the device isolation pattern 68. The edge of the conductive layer pattern 72 may extend over an upper protruding surface of the device isolation pattern 68.

The tunnel insulating layer 70 may be, for example, a silicon oxide layer, a silicon oxynitride layer, or layers of silicon oxide and silicon oxynitride that are alternately stacked. The density of oxygen atoms or nitrogen atoms that contact the substrate 50 adjacent to the protruding portion of the device isolation pattern 68 may be reduced during formation of the tunnel insulating layer 70 because the protruding portion of the device isolation pattern 68 may reduce the amount oxygen atoms or nitrogen atoms that can reach the substrate 50. As a result, an edge of the tunnel insulating layer 70 in the region 70a adjacent to the device isolation pattern 68 may be thinner than a central portion of the tunnel insulating layer 70 between the device isolation patterns 68.

The flash memory device may include a device isolation pattern having a silicon nitride liner.

Figure 20:
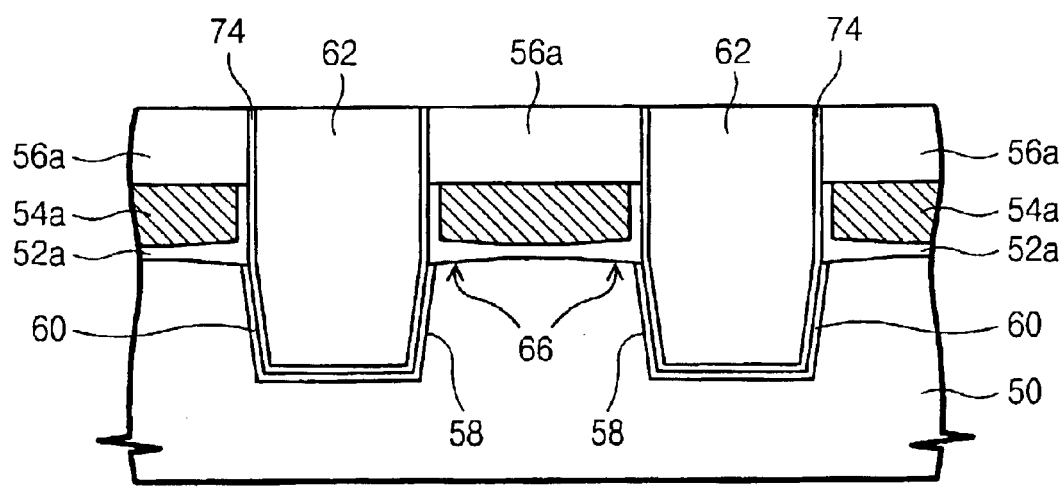
Figure 21:
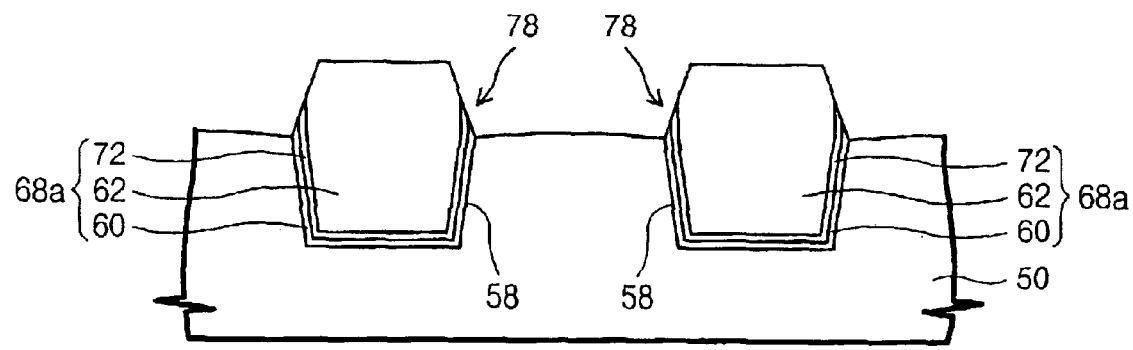
Figure 22:
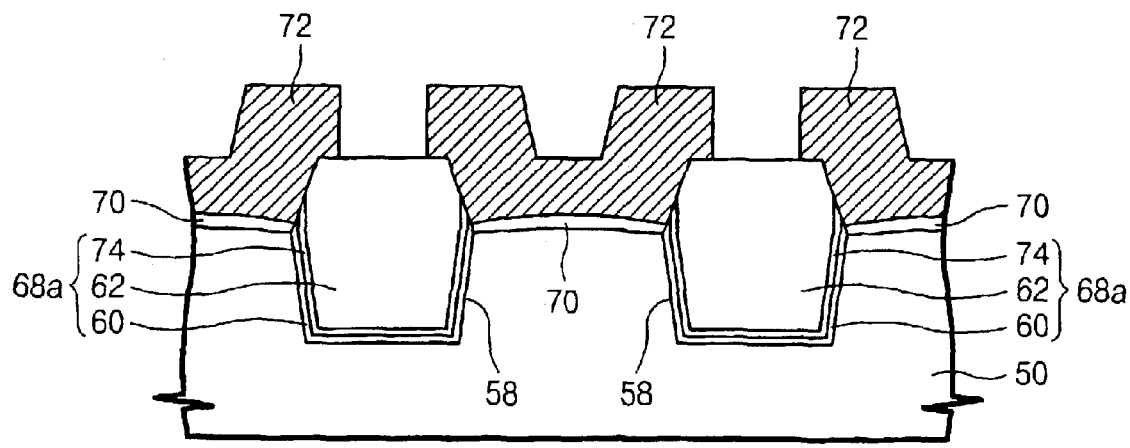

Referring to FIGS. 20–22, after the trench oxide layer 60 is formed, a silicon nitride layer may be conformally formed on an entire surface of the semiconductor substrate 50. An insulating layer may be formed thereon and shaped, for example, by chemical mechanical polishing (CMP) to form the insulating layer pattern 62 and a silicon nitride liner 74. The insulating layer pattern 62 may be formed on the silicon nitride liner 74 to fill the trench 58 and the gap area between the hard mask patterns. The silicon nitride pattern 56a, the polysilicon pattern 54a, and the buffer oxide pattern 52 may be removed. A portion of the insulating layer pattern 62 that protrudes beyond the top surface of the substrate 50 may be etched to form sloped sidewalls, as illustrated in FIG. 21. The device isolation patterns 68a include the trench oxide layer 60, the silicon nitride liner 72, and the insulating layer pattern 62. The tunnel insulating layer 70 and the conductive layer pattern 72 are formed on the substrate 50 between the device isolation patterns 68a.

Figure 23:
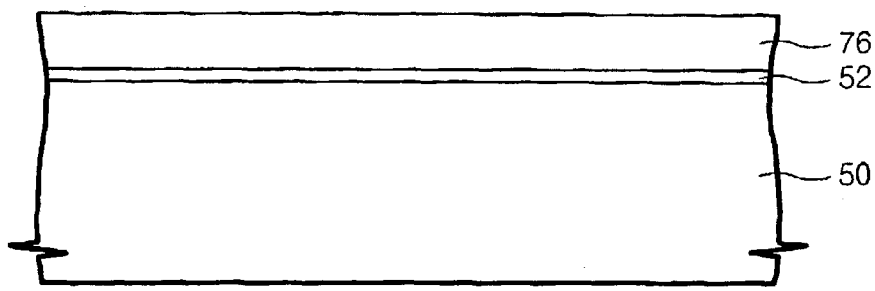

FIGS. 23–27 illustrate another embodiment of the present invention. Referring to FIG. 23, the buffer oxide layer 52 and a silicon nitride layer 76 may be sequentially formed on an entire surface of the substrate 50.

Figure 24:
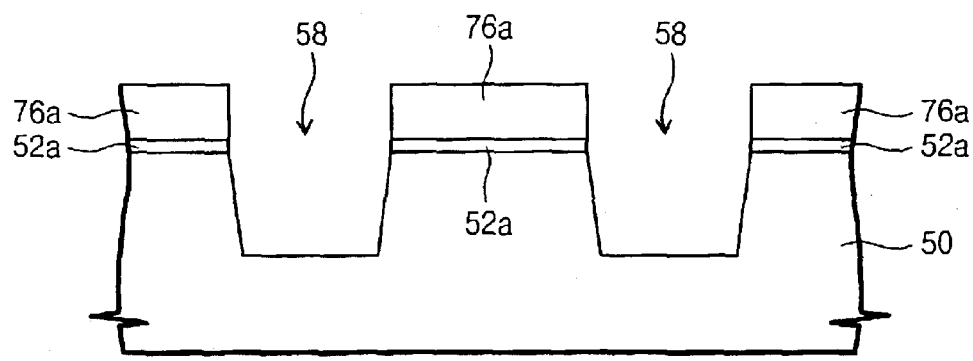

Referring to FIG. 24, the silicon nitride layer 76 and the buffer oxide layer 52 may be successively patterned to form a hard mask pattern on the substrate 50. The hard mask pattern may include a buffer oxide pattern 52a and a silicon nitride pattern 76a that are sequentially stacked.

The silicon nitride layer 76a may have a sufficient thickness (e.g., 1000 angstroms or more) so that a subsequently formed device isolation pattern will protrude beyond the top surface of the substrate 50. Using the hard mask pattern as an etching mask, the substrate 50 is etched to form a trench 58.

Figure 25:
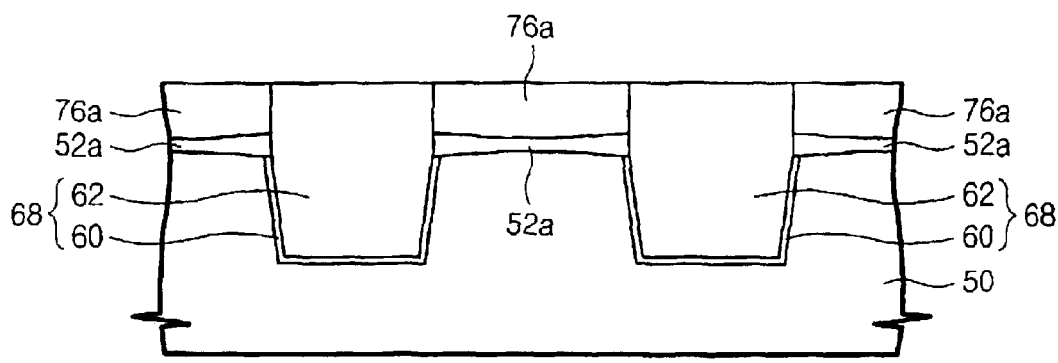

Referring to FIG. 25, the trench 58 in the substrate 50 may be thermally oxidized to form a trench oxide layer 60 on an inner sidewall of the trench 58. The insulating layer pattern 62 may be formed to fill the trench 58 and the gap area between the hard mask patterns.

Figure 26:
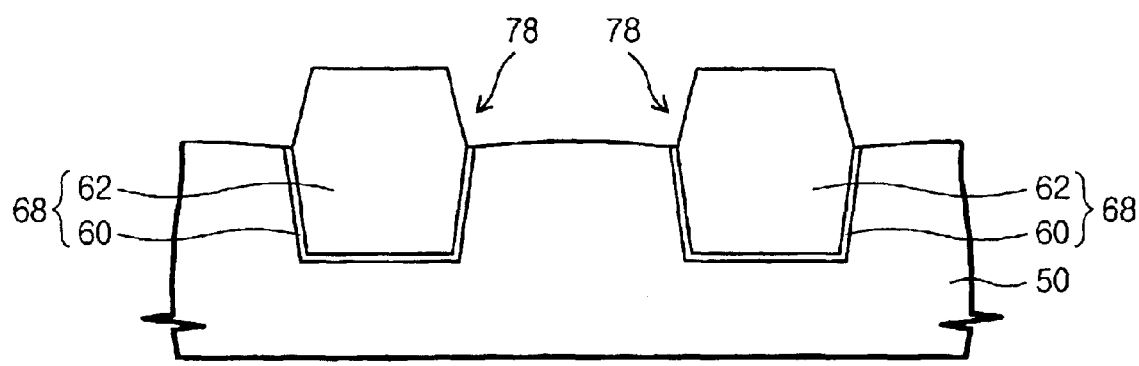
Figure 27:
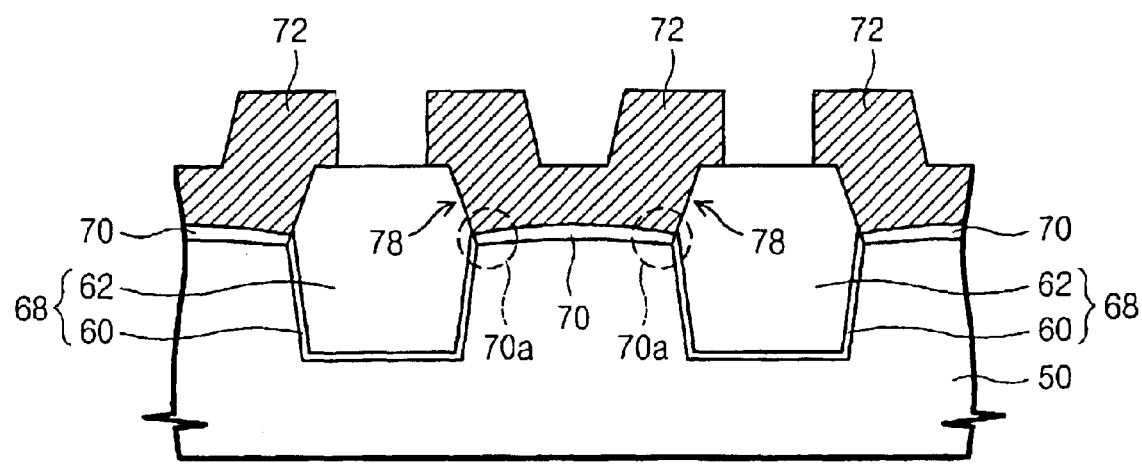

Referring to FIGS. 25–26, the hard mask pattern may be removed by, for example, wet etching. The buffer oxide layer pattern 52a may be etched together with a portion of the insulating layer pattern 62 that protrudes beyond the top surface of the substrate 50. The device isolation pattern 68 may include the trench oxide layer 60 and the insulating layer pattern 62. Upper sidewalls 78 of the device isolation pattern 68 protrude beyond the top surface of the substrate 50. The protruding upper sidewalls 78 of the device isolation pattern 68 are sloped as shown in FIG. 27. The height of the protruding portion of the device isolation pattern 68 can be adjusted by adjusting the thickness with which the silicon nitride layer 76 is formed, as shown in FIG. 25.

Referring to FIG. 27, the tunnel insulating layer 70 and the conductive layer pattern 72 are formed on the substrate 50 between the device isolation patterns. An edge portion of the tunnel insulating layer 70 that is adjacent to the device isolation pattern 68 may be thinner than a central portion of the tunnel insulating layer 70. The edge portion of the tunnel insulating layer 70 shown in FIG. 27 may be thicker than the edge portion of the tunnel insulating layer 70 that is shown in FIG. 19 because the upper sidewall of the trench 70 may be partially exposed during removal of the buffer oxide layer pattern 52a and because an oxide layer is not formed on a sidewall of the silicon nitride pattern 76a during formation of a trench oxide layer 60. The increased thickness of the edge portion of the tunnel insulating layer 70 may avoid excessive memory cell write speeds and may prevent a leakage current from flowing through the edge portion of the tunnel insulating layer 70.

Although not shown in the figure, an interlayer dielectric and a control gate conductive layer may be formed on an entire surface of the substrate 50. Subsequent processes may be performed to fabricate a flash memory device from the resulting structure. As previously described, the sloped sidewall 78 of the protruding portion of the device isolation pattern 68 may prevent the formation of stringers, and may, thereby, prevent a short-circuit between adjacent floating gate patterns 72.

A flash memory device according to other embodiments of the present invention is now described with reference to FIG. 28.

Figure 28:
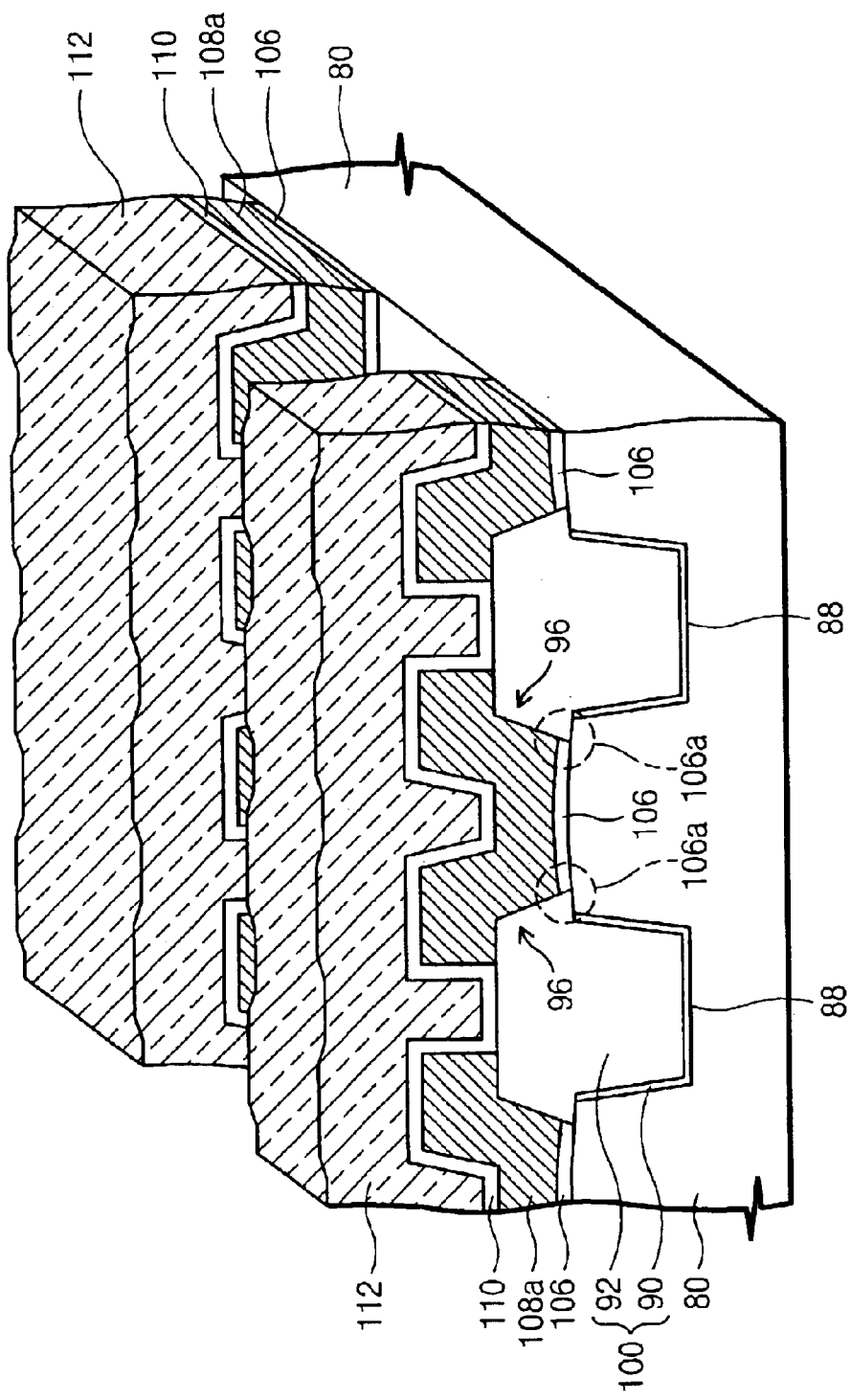
FIG. 28 is a perspective view of a flash memory device according to some other embodiments of the present invention.

Referring to FIG. 28, a flash memory device may include a device isolation pattern whose upper edge is laterally extended. A trench 88 is formed in a semiconductor substrate 80, and a device isolation pattern 100 is formed in the trench 88. The device isolation pattern 100 includes a trench oxide layer 90 formed on an inner sidewall of the trench 88 and an insulating layer pattern 92 is formed in the trench 88 on the trench oxide layer 90. An upper portion of the insulating layer pattern 92 protrudes from a top surface of the substrate 80. The protruding upper portion of the insulating layer pattern 92 laterally extends to overlap with the top surface of the substrate 80. Sidewalls 96 of the protruding upper portion of the insulating layer pattern 92 are sloped. A plurality of control gate electrodes 112 extend across the device isolation patterns 100 in parallel. A floating gate pattern 108 is disposed between the control gate electrode 112 and the substrate 80. An intergate dielectric 110 is disposed between the control gate electrode 112 and the floating gate pattern 108a. The tunnel insulating layer 106 is disposed between the floating gate pattern 108a and the substrate 80. The tunnel insulating layer 106 may be formed on an entire surface of the substrate 80 between the device isolation patterns 100.

Because the protruding upper portion of the insulating layer pattern 92 laterally extends over the substrate 80 and has sloped sidewalls 96, the formation of stringers may be prevented or reduced, which may prevent a short-circuit between adjacent floating gate patterns 108a.

A method of fabricating the flash memory device that is illustrated in FIG. 28 according to embodiments of the present invention is now described below with reference to FIGS. 29–36.

Figure 29:
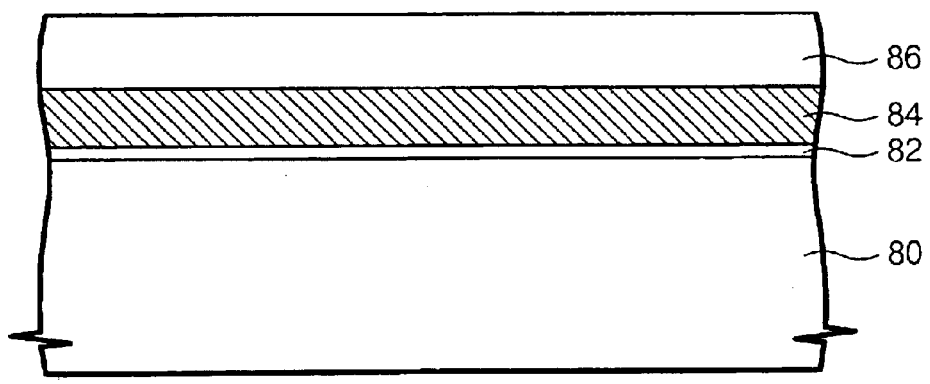
FIGS. 29–36 are cross-sectional views that illustrating steps for fabricating flash memory devices according to some other embodiments of the present invention.

Referring to FIG. 29, a buffer oxide layer 82, a polysilicon layer 84, and a silicon nitride layer 86 are sequentially formed on the substrate 80. An oxide layer may additionally be formed between the polysilicon layer 84 and the silicon nitride layer 86.

Figure 30:
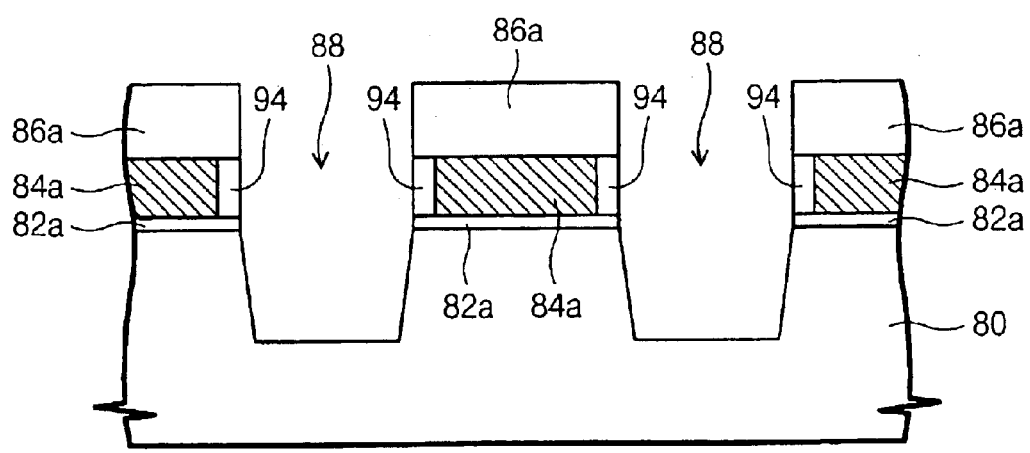

Referring to FIG. 30, the silicon nitride layer 86, the polysilicon layer 84, and the buffer oxide layer may be successively patterned to form a plurality of hard mask patterns on the substrate 80. Each of the hard mask patterns may include a buffer oxide pattern 82a, a polysilicon pattern 84a, and a silicon nitride pattern 86a which are sequentially stacked. The substrate 80 may be thermally oxidized to form a sidewall oxide layer 94 on a sidewall of the polysilicon pattern 84a and to reduce a width of the polysilicon pattern 84a. Using the hard mask pattern as an etch-stop layer, the substrate 80 may be etched to form trenches 88 aligned to an outer sidewall of the sidewall oxide layer 94. Prior to formation of the trenches 88, an oxide layer that may be formed on the substrate 80 during formation of the sidewall oxide layer 94 may be removed, for example, by an isotropic etching.

Figure 31:
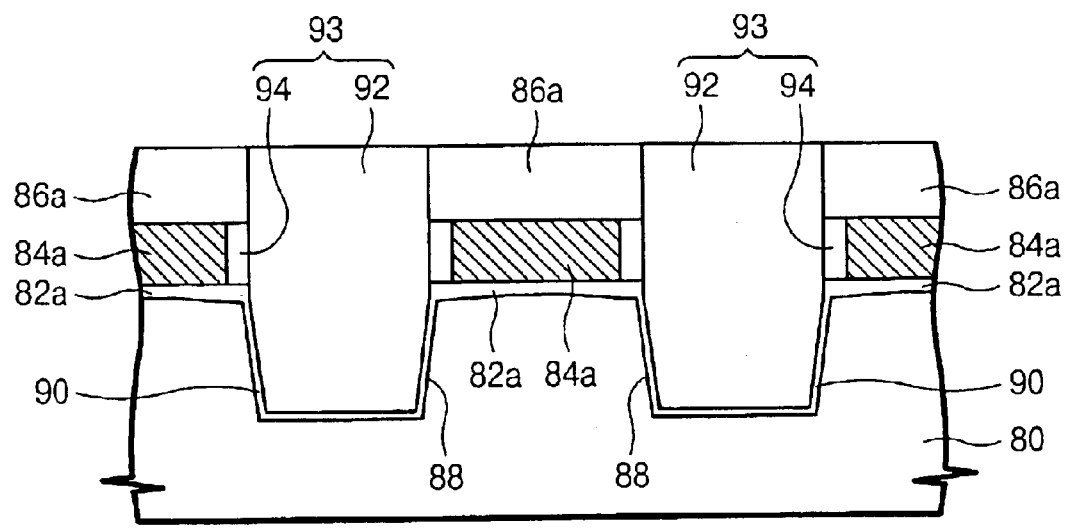

Referring to FIG. 31, the trench 88 in the semiconductor substrate 80 may be thermally oxidized to form a trench oxide layer 90 on an inner sidewall of the trench 80. An insulating layer 92 may fill the trench 88 and the gap area between the hard mask patterns. The insulating layer pattern 93 may include the sidewall oxide layer 94 and the insulating layer 92. The insulating layer 92 may be a material having a good trench filling property, such as high-density plasma (HDP) oxide or plasma enhanced oxide (PEOX).

Figure 32:
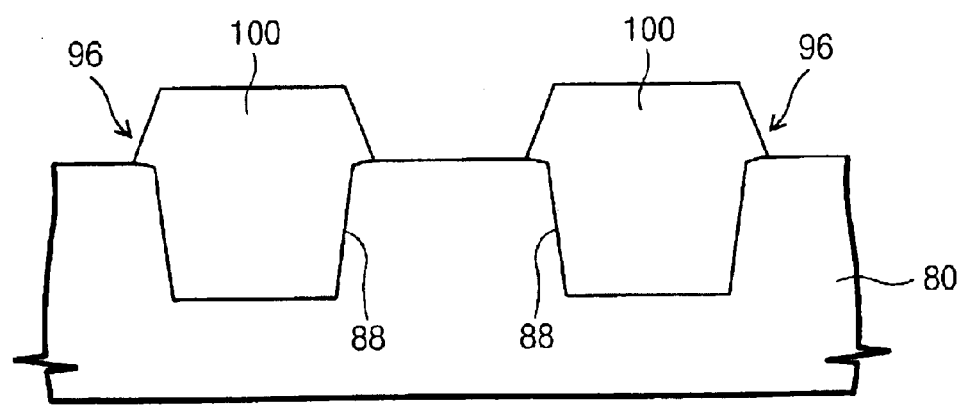

Referring to FIG. 32, the silicon nitride pattern 86a is removed by, for example, wet etching using a phosphoric acid solution. The polysilicon pattern 84a may then be removed by, for example, wet etching or dry etching.

The substrate 80 where the polysilicon pattern 84a is removed, may be isotropically etched to remove the buffer oxide pattern 82a. A sloped sidewall 96 may be formed along edges of the insulating layer pattern 93 that protrude beyond the top surface of the semiconductor substrate 80. Dry etching and/or the wet etching may be alternately performed to adjust a height of the protruding portion of the insulating layer pattern 93. The insulating layer pattern 93 and the trench oxide layer 90 may form a device isolation pattern 100. As shown in FIG. 32, an upper portion of the device isolation pattern 100 protrudes beyond the top surface of the semiconductor substrate 80 and an edge of the device isolation pattern 100 is laterally extended to overlap with a top surface of a semiconductor substrate 80 that is adjacent to the trench 88.

The semiconductor substrate 80 may be thermally oxidized to form a sacrificial oxide layer, which may be later removed.

A method of fabricating the flash memory device according to embodiments of the present invention is now described below with reference to FIGS. 33–35.

Figure 33:
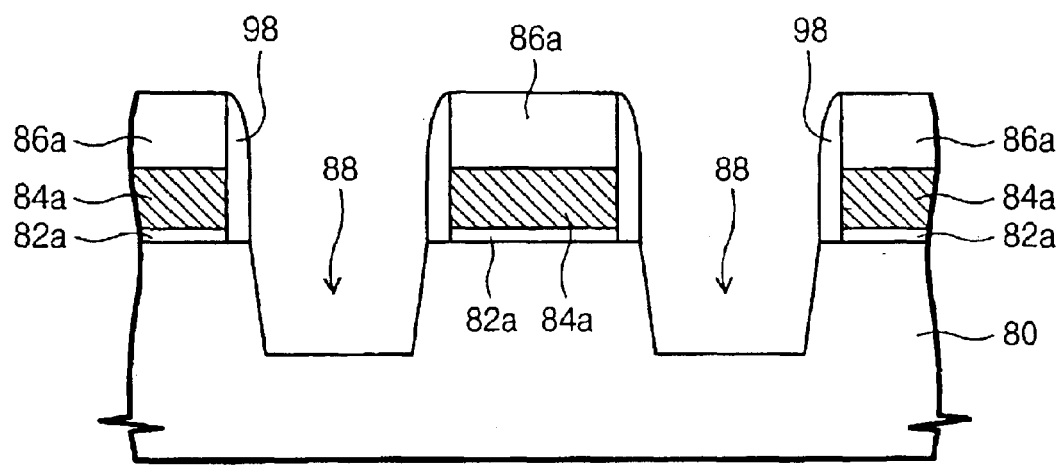

Referring to FIG. 33, an oxide spacer 98 is formed on a sidewall of a hard mask pattern. Using the hard mask pattern and the oxide spacer 98 as an etch-stop layer, the substrate 80 may be etched to form trenches 88 each being aligned to an outer sidewall of the oxide spacer 98.

Figure 34:
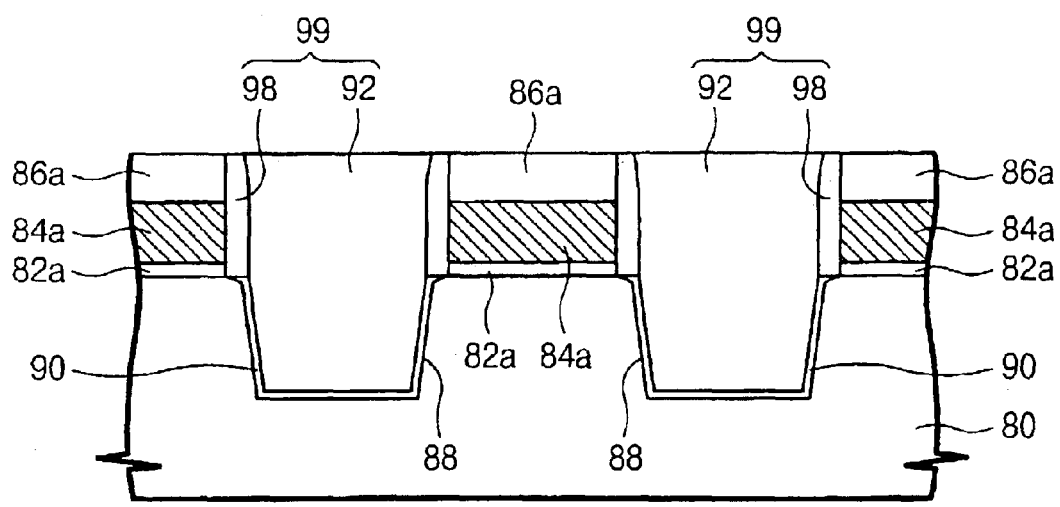
Figure 35:
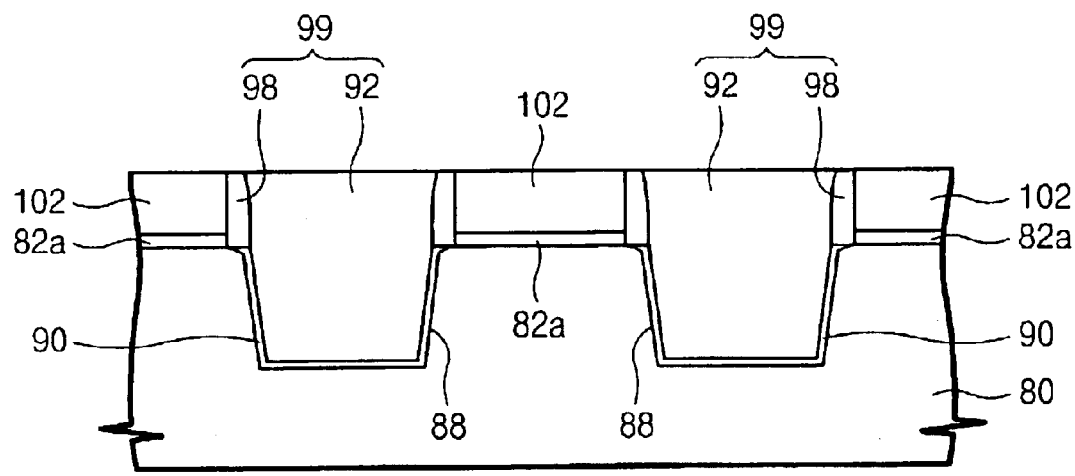

Referring to FIG. 34, the trench 88 in the substrate 80 may be thermally oxidized to form a trench oxide layer 90 on an inner sidewall of the trench 88. An insulating layer pattern 92 may be formed in the trench 88 and filling a gap area between the hard mask patterns. The oxide spacer 98 and the insulating layer 92 may form an insulating layer pattern 99. The insulating layer 92 may be a material having a good trench filling property, such as high-density plasma (HDP) oxide or plasma enhanced oxide (PEOX). The hard mask pattern in the present embodiment may include a buffer oxide patter 82a and a silicon nitride pattern 102 which are sequentially stacked, as shown in FIG. 35.

Figure 36:
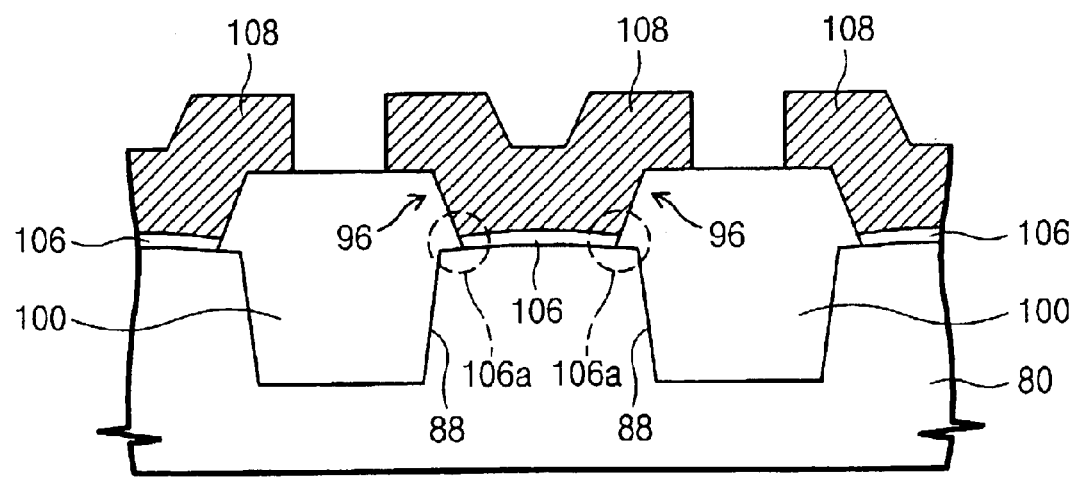

Referring to FIG. 36, the silicon nitride pattern 86a is removed by, for example wet etching using a phosphoric acid solution. The polysilicon pattern 84a is removed by, for example, a wet etching and/or a dry etching.

The substrate 80 where the polysilicon pattern 84a is removed may be isotropically etched to remove the buffer oxide layer 82a. A sloped sidewall 96 is formed along edges of the insulating layer pattern 99 that protrude beyond the top surface of the substrate 80. A wet etch and/or a dry etch may be alternately performed to adjust the height of the insulating layer pattern 99. The insulating layer pattern 99 and the trench oxide layer 90 may form a device isolation pattern 100. As shown in FIG. 36, an upper portion of the device isolation pattern 100 protrudes beyond the top surface of the substrate 80 and an edge of the device isolation pattern 100 laterally extends to overlap with the top surface of the substrate 80.

The tunnel insulating layer 106 and a conductive layer pattern 108 may be formed on the semiconductor substrate 80 between the device isolation patterns 100. An edge 106a of the tunnel insulating layer that is adjacent to the device isolation pattern 100 may be thinner than a central portion of the tunnel insulating layer 106 between device isolation patterns 100.

Although not shown in the figure, an interlayer dielectric and a control gate conductive layer may be formed on an entire surface of the substrate 80 where a conductive layer pattern may be formed. Thereafter, conventional processes may be performed to fabricate a flash memory device.

The sloped sidewalls of the protruding upper portion of the device isolation pattern may reduce or prevent the formation of stringers and the associated short-circuits between adjacent floating gate patterns.

When the floating gate pattern conformally covers the protruding sidewalls of the device isolation pattern and the semiconductor substrate, their coupling ratio may be enhanced and parasitic capacitance between adjacent floating gate patterns may be lowered. Lower parasitic capacitance may decrease any fluctuation in the threshold voltage of the cell array.

When an edge portion of the tunnel oxide layer that is adjacent to a device isolation pattern is less thick than its more central region, a high writing speed for the memory device may be obtained. The thin edge of the tunnel oxide layer may also avoid its trap density from becoming unacceptably high during repeated write and erase cycles.

While the invention has been described in detail in terms of specific embodiments, those skilled in the art will recognize that the invention can be practiced with various modifications or changes within the spirit and scope of the appended claims.

What is claimed is:

1. A flash memory device comprising:
   a substrate;
   a plurality of parallel trenches in the substrate; and
   a device isolation pattern in the trenches that protrudes with sloped sidewalls away from a top surface of the substrate.

2. The flash memory device as recited in claim 1, wherein the sloped sidewalls of the device isolation pattern are sloped toward each other so that an upper surface of the device isolation pattern has less width than an upper portion of the trench.

3. The flash memory device as recited in claim 1, further comprising:
   a tunnel insulating layer on the substrate between the device isolation patterns; and
   a floating gate pattern on the tunnel insulating layer, wherein an edge of the floating gate pattern laterally overlaps an upper side of the device isolation pattern.

4. The flash memory device as recited in claim 3, wherein the tunnel insulating layer is from the group consisting of silicon oxide, silicon oxynitride, metal oxide, and combinations thereof.

5. The flash memory device as recited in claim 3, wherein the floating gate pattern is polysilicon.

6. The flash memory device as recited in claim 3, wherein an edge of the tunnel insulating layer that is adjacent to the device isolation pattern is less thick than a central portion of the tunnel insulating layer between the device isolation pattern.

7. The flash memory device as recited in claim 1, wherein the device isolation pattern comprises:
   a trench oxide layer on an inner sidewall of the trench; and
   an insulating layer pattern in the trench that protrudes away from the top surface of the substrate.

8. The flash memory device as recited in claim 7, further comprising a silicon nitride line intervened between the trench oxide layer and the insulating layer pattern.

9. The flash memory device as recited in claim 1, wherein the protruding sloped sidewalls of the device isolation pattern laterally extend to overlap an edge portion of the top surface of the substrate.

10. The flash memory device as recited in claim 9, wherein the device isolation pattern comprises:
    a trench oxide layer on an inner sidewall of the trench; and
    an insulating layer pattern in the trench that protrudes away from the top surface of the substrate, and wherein the insulating layer pattern laterally extends to overlap with a portion of the top surface of the substrate.

11. The flash memory device as recited in claim 10, further comprising a silicon nitride liner between the trench oxide layer and the insulating layer pattern.

12. The flash memory device as recited in claim 10, wherein an edge of the silicon nitride liner contacts the insulating layer pattern and is spaced apart from the trench oxide layer.

13. The flash memory device as recited in claim 1, further comprising:

an intergate dielectric pattern on the floating gate pattern; and a control gate electrode on the intergate dielectric pattern.

14. The flash memory device as recited in claim 13, wherein the intergate dielectric pattern comprises at least one high-k dielectric film.

15. The flash memory device as recited in claim 14, wherein the high-k dielectric film is from the group consisting of silicon nitride, tantalum oxide, and aluminum oxide (alumina).

16. The flash memory device as recited in claim 14, wherein the intergate dielectric pattern comprises silicon oxide.

* * * * *

UNITED STATES PATENT AND TRADEMARK OFFICE
CERTIFICATE OF CORRECTION

PATENT NO. : 6,927,447 B2
DATED : August 9, 2005
INVENTOR(S) : Jeong-Hyuk Choi et al.

It is certified that error appears in the above-identified patent and that said Letters Patent is hereby corrected as shown below:

Title page,
Item [56], References Cited, add the following: U.S. PATENT DOCUMENTS;
-- 5,892,257     *     04/1999     Acocelia et al......................257/316
5,766,971     *     06/1998     Ahigren et al.......................438/296
5,622,881     *     04/1997     Acocelia et al......................438/264 --;
add:
-- FOREIGN PATENT DOCUMENTS;
KO          10-1995-0034078          10/1995
JP          09-213783                08/1997
JP          2001/250871              09/2001
KO          2001-0107244 A           12/2001 --; and
add:
-- NON-PATENT DOCUMENTS;
Translation of Korean Office Action dated June 23, 2004 --.

Column 10,
Line 17, should read -- substrate; and --.
Line 18, insert the following:
    -- A tunnel insulating layer on the substrate extending between the device isolation patterns, wherein an edge of the tunnel insulating layer that is adjacent to the device isolation pattern is less thick than a central portion of the tunnel insulating layer between the device isolation patterns. --.
Line 23, should read -- 3. The flash memory device as recited in claim 9. further --.
Lines 36-40, should be deleted.
Line 41, should read -- 7. The flash memory device as recited in claim 9. wherein --.
Lines 50-53, should read
    -- 9.    A flash memory device comprising:
        a substrate;
        a plurality of parallel trenches in the substrate; and
        a device isolation pattern in the trenches that protrudes with sloped sidewalls away from a top surface of the substrate.
        wherein the protruding sloped sidewalls of the device isolation pattern laterally extend to overlap an edge portion of the top surface of the substrate. --.

UNITED STATES PATENT AND TRADEMARK OFFICE
CERTIFICATE OF CORRECTION

PATENT NO.    : 6,927,447 B2
DATED         : August 9, 2005
INVENTOR(S)   : Jeong-Hyuk Choi et al.

It is certified that error appears in the above-identified patent and that said Letters Patent is hereby corrected as shown below:

Column 11,
Line 1, should read -- 13. The Flash memory device as recited in claim 9. further --.

Signed and Sealed this

Twenty-eighth Day of February, 2006

JON W. DUDAS
*Director of the United States Patent and Trademark Office*